(12) United States Patent
Jeong et al.

(10) Patent No.: US 10,797,149 B2
(45) Date of Patent: Oct. 6, 2020

(54) THIN FILM TRANSISTOR INCLUDING HIGH-DIELECTRIC INSULATING THIN FILM AND METHOD OF FABRICATING THE SAME

(71) Applicant: Industry-University Cooperation Foundation Hanyang University, Seoul (KR)

(72) Inventors: Jae Kyeong Jeong, Seoul (KR); Ji Won Lee, Yongin-si (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 16/123,590

(22) Filed: Sep. 6, 2018

(65) Prior Publication Data

US 2019/0088758 A1  Mar. 21, 2019

(30) Foreign Application Priority Data

Sep. 7, 2017  (KR) ........................ 10-2017-0114200

(51) Int. Cl.
*H01L 29/49* (2006.01)
*H01L 29/786* (2006.01)
(Continued)

(52) U.S. Cl.
CPC .... *H01L 29/4908* (2013.01); *H01L 21/02178* (2013.01); *H01L 21/02192* (2013.01);
(Continued)

(58) Field of Classification Search
CPC ............. H01L 29/4908; H01L 29/7869; H01L 29/517; H01L 21/02348; H01L 21/02194;
(Continued)

(56) References Cited

U.S. PATENT DOCUMENTS 8,309,961 B2  11/2012 Yamazaki et al.
2007/0194312 A1 *  8/2007 Chuman ............. G02F 1/13454
257/59

(Continued)

FOREIGN PATENT DOCUMENTS

JP  2013-131765 A  7/2013
JP  2016-197631 A  11/2016

*Primary Examiner* — David Vu
(74) *Attorney, Agent, or Firm* — Sughrue Mion, PLLC

(57) ABSTRACT

Disclosed are a thin film transistor including a substrate and a gate electrode, a gate insulating film, a semiconductor layer, a source electrode, and a drain electrode formed on the substrate and a method of fabricating the thin film transistor, wherein the gate insulating film is made of a high dielectric ternary material, $A_{2-x}B_xO_3$, wherein A is any one selected from the group consisting of aluminum, silicon, gallium, germanium, neodymium, gadolinium, vanadium, lutetium, and actinium, B is any one selected from the group consisting of yttrium, lanthanum, zirconium, hafnium, tantalum, titanium, vanadium, nickel, silicon, and ytterbium, and A is an element different from B. The gate insulating film may be formed through a solution process, and a high-quality insulating film may be obtained through heat treatment at low temperature.

13 Claims, 5 Drawing Sheets

(51) Int. Cl.
  *H01L 29/51* (2006.01)
  *H01L 21/02* (2006.01)
  *H01L 21/445* (2006.01)
(52) U.S. Cl.
  CPC .. *H01L 21/02194* (2013.01); *H01L 21/02205* (2013.01); *H01L 21/02282* (2013.01); *H01L 21/02348* (2013.01); *H01L 21/445* (2013.01); *H01L 29/517* (2013.01); *H01L 29/7869* (2013.01)
(58) Field of Classification Search
  CPC ......... H01L 21/02205; H01L 21/02282; H01L 21/445; H01L 21/02178; H01L 21/02192
  See application file for complete search history.

(56) References Cited

U.S. PATENT DOCUMENTS

2016/0247927 A1* 8/2016 Nomura .............. H01L 29/7869
2017/0352539 A1* 12/2017 Yang ................. H01L 21/02197

* cited by examiner

THIN FILM TRANSISTOR INCLUDING HIGH-DIELECTRIC INSULATING THIN FILM AND METHOD OF FABRICATING THE SAME

CLAIM FOR PRIORITY

This application claims priority to Korean Patent Application No. 2017-0114200 filed on Sep. 7, 2017 in the Korean Intellectual Property Office (KIPO), the entire contents of which are hereby incorporated by reference.

BACKGROUND

1. Technical Field

Embodiments of the present invention relate in general to a thin film transistor including a high-dielectric insulating thin film and a method of fabricating the same, and more specifically, to a thin film transistor including a high-dielectric gate insulating film formed by a solution process and a method of fabricating the same.

2. Related Art

Metal oxide semiconductors have a high field-effect mobility of about 10 cm$^2$/V·s and a low crystallization temperature of 250° C. to 400° C., thereby attracting attention as a next generation display material for replacing amorphous silicon.

In a thin film transistor using a metal oxide semiconductor, a gate insulating film forms an interface along with a semiconductor layer. Therefore, a gate insulating film may be an important component that determines the performance of a thin film transistor because the crystallinity, shape, etc. of a semiconductor can be determined depending upon the characteristics of the interface with the gate insulating film.

A conventional silicon oxide (SiO$_2$) insulating film, which has been used as a gate insulating film, is formed by thermally oxidizing a silicon substrate at high temperature. Such a high-temperature thermal oxidization process has a problem of increasing production costs. In addition, as speed and scaling of semiconductor devices progress, demand for a thinner gate insulating film is increasing. In the future 0.10 μm scale process, the thickness of a gate insulating film should be 25 Å to 30 Å. A thickness of 25 Å to 30 Å can be a maximum thickness to prevent tunneling of a silicon oxide insulating film, which results in an increase in off-current due to direct tunneling of a carrier and thus deterioration in performance of a device.

To reduce leakage current, research on application of a high-dielectric material with a high dielectric constant (high-k dielectric material) to a gate insulating film is underway. Recently, high-dielectric materials, such as alumina (Al$_2$O$_3$), hafnium oxide, tantalum oxide, and silicon nitride, have attracted attention as a material for gate insulating films. When such high-dielectric materials are used in a gate insulating film, the thickness and width of the gate insulating film can be reduced and a thin film transistor can be driven at low voltage.

Vacuum-based thin film deposition methods such as sputtering, chemical vapor deposition, and atomic layer deposition, which have been used to form a gate insulating film, increase process costs and complicate a fabrication process. Therefore, the need for a solution process-based thin film deposition method, a process of which is simple, the cost of which is low, and which exhibits a high yield is increasing.

SUMMARY

Accordingly, embodiments of the present invention are provided to substantially obviate one or more problems due to limitations and disadvantages of the related art.

Embodiments of the present invention provide a thin film transistor provided with a gate insulating film including a ternary high-dielectric material, $A_{2-x}B_xO_3$.

Embodiments of the present invention also provide a method of fabricating a thin film transistor provided with a gate insulating film including a ternary high-dielectric material, $A_{2-x}B_xO_3$.

In some embodiments, a thin film transistor includes a substrate and a gate electrode, a gate insulating film, a semiconductor layer, a source electrode, and a drain electrode formed on the substrate, wherein the gate insulating film is made of a ternary material, $A_{2-x}B_xO_3$, having a higher dielectric constant than SiO$_2$, wherein A is any one selected from the group consisting of aluminum, silicon, gallium, germanium, neodymium, gadolinium, vanadium, lutetium, and actinium, B is any one selected from the group consisting of yttrium, lanthanum, zirconium, hafnium, tantalum, titanium, vanadium, nickel, silicon, and ytterbium, and A is an element different from B.

For example, the gate insulating film may be $Al_{2-x}Y_xO_3$.

In an embodiment, x in $A_{2-x}B_xO_3$ may be 0.4 to 1.85. In another embodiment, x may be 1 to 1.82. In still another embodiment, x may be 1.78 to 1.82.

The gate insulating film may have a thickness of 30 nm to 40 nm.

The semiconductor layer may include at least any one of InZnO, InGaZnO, ZnO, ZnSnO, InSnO, InZnSnO, HfInZnO, ZrZnSnO, and HfZnSnO.

In other embodiments, a method of fabricating a thin film transistor including a substrate and a gate electrode, a gate insulating film, a semiconductor layer, a source electrode, and a drain electrode formed on the substrate includes a step of mixing a precursor of element A and a precursor of element B with a dispersion medium to prepare a gate insulating film solution, a step of applying the gate insulating film solution on the gate electrode or the semiconductor layer, and a step of heat-treating the applied gate insulating film solution to form a gate insulating film, wherein the gate insulating film is a ternary high-dielectric material, $A_{2-x}B_xO_3$, wherein A is any one selected from the group consisting of aluminum, silicon, gallium, germanium, neodymium, gadolinium, vanadium, lutetium, and actinium, B is any one selected from the group consisting of yttrium, lanthanum, zirconium, hafnium, tantalum, titanium, vanadium, nickel, silicon, and ytterbium, and A is an element different from B.

For example, A may be aluminum, and B may be yttrium.

The precursors of elements A and B may be metal nitrate hydrates, and the dispersion medium may be any one or more selected from isopropanol, 2-methoxyethanol, dimethylformamide, ethanol, deionized water, methanol, acetyl acetone, and acetonitrile.

In an embodiment, a molar ratio of the precursor of element B with respect to 1 mole of the precursor of element A may be 0.25 to 12. In another embodiment, a molar ratio of the precursor of element B with respect to 1 mole of the precursor of element A may be 1 to 10. In still another embodiment, a molar ratio of the precursor of element B with respect to 1 mole of the precursor of element A may be 8 to 10.

In the step of applying the gate insulating film solution on the gate electrode or the semiconductor layer, any one method of spin coating, bar coating, dip coating, nanoimprinting, and inkjet printing may be used.

In the step of heat-treating the applied gate insulating film solution, the heat treatment may be performed at 250° C. to 400° C. Further, ultraviolet light may be irradiated while performing the heat treatment.

BRIEF DESCRIPTION OF DRAWINGS

Example embodiments of the present invention will become more apparent by describing example embodiments of the present invention in detail with reference to the accompanying drawings, in which.

DESCRIPTION OF EXAMPLE EMBODIMENTS

Figure 1:
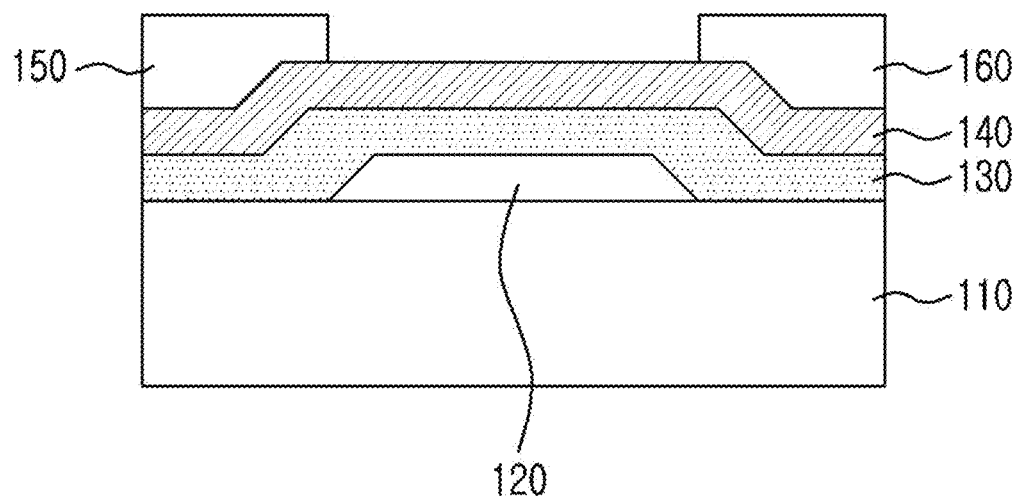
FIG. 1 is a sectional view illustrating the structure of a thin film transistor according to an embodiment of the present invention.

Embodiments of the present invention are disclosed in detail with reference to the accompanying drawings.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It will be understood that when a layer, an area, or a substrate is referred to as being "on" another layer, area, or substrate, it can be directly on the other layer, area, or substrate or an intervening layer, area, or substrate may be present therebetween.

It will be understood that, although the terms first, second, etc. may be used herein to describe various elements, components, layers, and/or regions, these elements, components, layers, and/or regions should not be limited by these terms.

Example Embodiments

Hereinafter, a thin film transistor according to an embodiment of the present invention is described.

FIG. 1 is a sectional view illustrating the structure of a thin film transistor according to an embodiment of the present invention.

Referring to FIG. 1, a thin film transistor according to an embodiment of the present invention may include a substrate 110, a gate electrode 120 formed on the substrate 110, a gate insulating film 130 formed on the gate electrode 120, a semiconductor layer 140 formed on the gate insulating film 130, and a source electrode 150 and a drain electrode 160 formed on the semiconductor layer 140.

The substrate 110 may be made of various known materials. The substrate 110 may be, without being limited to, any one of a silicon substrate, a metal substrate, a glass substrate, a sapphire substrate, a quartz substrate, or a polymer substrate such as a polyethersulfone (PES) substrate, a polyethylene terephthalate (PET) substrate, a polyethylene naphthalate (PEN) substrate, a cyclic olefin copolymer (COC) substrate, a polyimide (PI) substrate, and a polydimethylsiloxane (PDMS) substrate. When the substrate 110 is made of a conductive material such as silicon or a metal, the gate insulating film 130 may be formed on a surface of the substrate 110 and the substrate 110, instead of the gate electrode 120, may be used as a back gate.

The gate electrode 120, the source electrode 150, and the drain electrode 160 may be made of any material with high conductivity, which has been generally used as an electrode, without specific limitation. The gate electrode 120 may include, without being limited to, any one of Ni, Cu, Zn, Au, Ag, Pt, Al, Ti, Pd, Cr, and alloys thereof.

The gate insulating film 130 may a ternary gate insulating film made of $A_{2-x}B_xO_3$ which is a ternary material with a higher dielectric constant than $SiO_2$. In $A_{2-x}B_xO_3$, A may be a material with an element size similar to that of aluminum and a large band gap to improve band gap characteristics of the ternary gate insulating film. For example, A may be any one selected from the group consisting of aluminum, silicon, gallium, germanium, neodymium, gadolinium, vanadium, lutetium, and actinium. B may be a material belonging to the same group as yttrium or having an element size similar to that of yttrium so that A atoms are arranged in gaps between B atoms having a larger atomic radius when mixed with element A to increase compactness of a thin film. For example, B may be any one selected from the group consisting of yttrium, lanthanum, zirconium, hafnium, tantalum, titanium, vanadium, nickel, silicon, and ytterbium. A may be an element different from B, and x may be 0.4 to 1.85. When x is less than 0.4, interfacial characteristics of the gate insulating film 130 are deteriorated, whereby the thin film transistor exhibits low carrier mobility and a dielectric constant is reduced to 12 or less. On the other hand, when x is greater than 1.85, a grain boundary of the gate insulating film 130 increases, whereby surface roughness increases. In addition, a leakage current increases, whereby an on/off ratio of a thin film transistor sharply deteriorates.

The gate insulating film 130 may have a thickness of 30 nm to 40 nm.

The semiconductor layer 140 may include at least any one of InZnO, InGaZnO, ZnO, ZnSnO, InSnO, InZnSnO, HfInZnO, ZrZnSnO, and HfZnSnO.

Portions of both ends of the semiconductor layer 140 are in electrical contact with the source electrode 150 and the drain electrode 160, respectively. The source electrode 150 and the drain electrode 160 may be formed on portions of both ends of the semiconductor layer 140 to form an inverted staggered structure as shown in FIG. 1, or may be formed under the semiconductor layer 140 to form an inverted coplanar structure.

Figure 2:
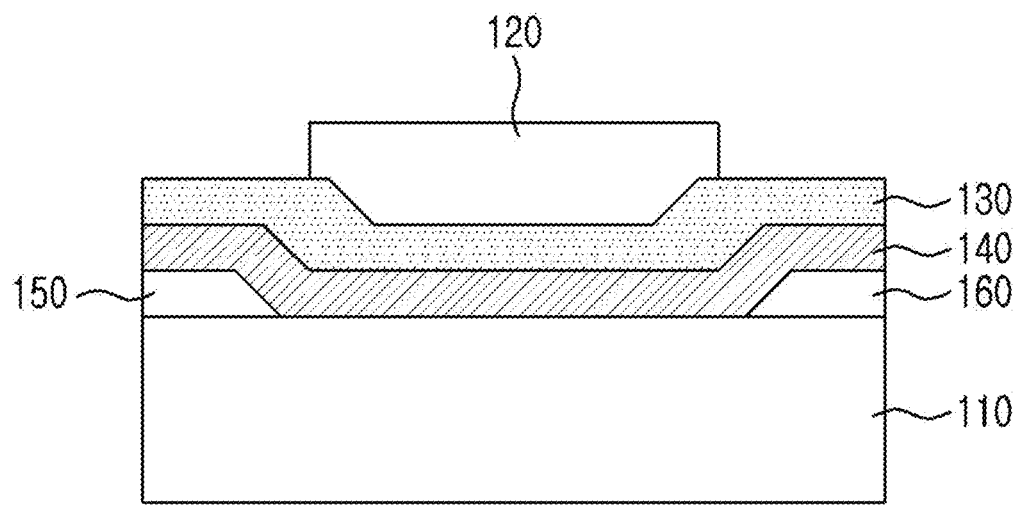
FIG. 2 is a sectional view illustrating the structure of a thin film transistor according to another embodiment of the present invention.

FIG. 2 is a sectional view illustrating the structure of a thin film transistor according to another embodiment of the present invention.

Components of FIG. 2 having structures and functions similar to those described in FIG. 1 will be described with reference to FIG. 1, and detailed descriptions thereof will be omitted.

Referring to FIG. 2, a thin film transistor may include a substrate 110, a source electrode 150 and a drain electrode 160 formed on the substrate 110, a semiconductor layer 140 formed to be in electrical contact with the source electrode 150 and the drain electrode 160, a gate insulating film 130 formed on the semiconductor layer 140, and a gate electrode 120 formed on the gate insulating film 130.

The thin film transistor shown in FIG. 2 has a top gate-type electrode structure and a structure wherein portions of both ends of the semiconductor layer 140 are in electrical contact with the source and drain electrodes 150 and 160, respectively. The source and drain electrodes 150 and 160 may be formed under the semiconductor layer 140 to form a staggered structure as shown in FIG. 2, or may formed on the semiconductor layer 140 to form a coplanar structure.

Figure 3:
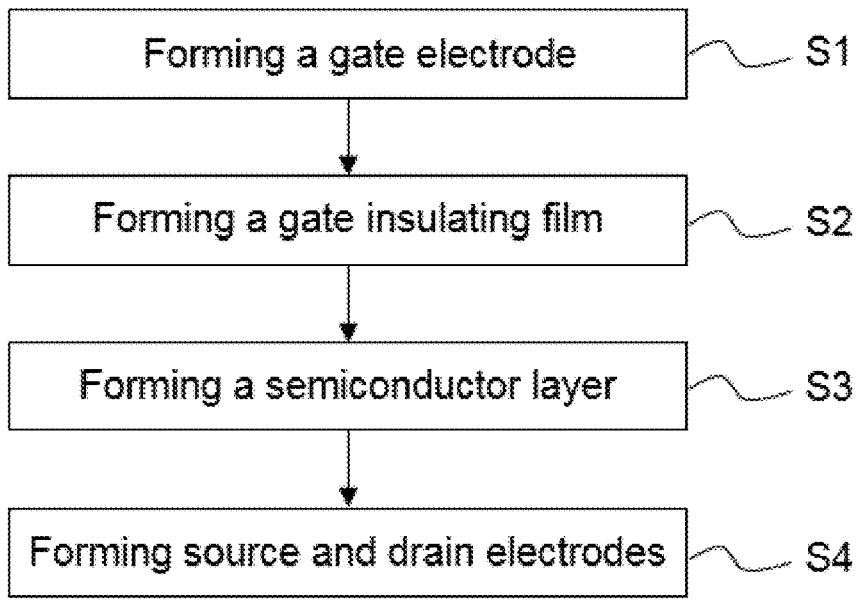
FIG. 3 is a flowchart illustrating a method of fabricating a thin film transistor according to an embodiment of the present invention.

FIG. 3 is a flowchart illustrating a method of fabricating a thin film transistor according to an embodiment of the present invention.

Referring to FIG. 3 along with FIG. 1, first, the gate electrode 120 is formed on the substrate 110 (S1). The gate electrode 120 may be formed, without being limited to, using a known metal deposition method such as sputtering, chemical vapor deposition, thermal evaporation, physical vapor deposition, or a solution process.

The gate insulating film 130 is formed on the gate electrode 120 (S2).

The gate insulating film 130 may be formed by applying a gate insulating film solution, which has been prepared by mixing a precursor of element A and a precursor of element B with a dispersion medium, on the gate electrode 120, followed by heat treatment. The precursors of elements A and B may be nitrate hydrates of A and B, respectively. The dispersion medium may be any one or more selected from isopropanol, 2-methoxyethanol, dimethylformamide, ethanol, deionized water, methanol, acetyl acetone, and acetonitrile. The precursor of element B may be mixed in a molar ratio of 0.25 to 12 with respect to 1 mole of the precursor of element A. This molar ratio is the same as a ratio of x to 2-x in $A_{2-x}B_xO_3$ that is a composition of a completed thin film. When a molar ratio of the precursor of element B is less than 0.25, interfacial characteristics of the gate insulating film 130 are deteriorated, thereby exhibiting low carrier mobility and a low dielectric constant of 12 or less. On the other hand, a molar ratio of the precursor B is greater than 12, a grain boundary of the gate insulating film 130 increases, whereby surface roughness increases. In addition, leakage current increases, whereby an on/off ratio of a thin film transistor is sharply decreased. In order for the precursors of elements A and B to be well mixed with the dispersion medium, the gate insulating film solution may further include nitric acid.

The gate insulating film solution may be applied on the gate electrode 120 using any one known solution process such as spin coating, bar coating, dip coating, nanoimprinting, and inkjet printing.

The applied gate insulating film solution may be subjected to pre-baking at 100° C.

The applied gate insulating film solution may be heat-treated at 250° C. to 400° C. to remove impurities, thereby forming a high-quality thin film. When the heat treatment is performed at less than 250° C., the dispersion medium and other impurities are not completely volatilized, whereby the properties of the gate insulating film are deteriorated. On the other hand, when the heat treatment is performed at greater than 400° C., a plastic or glass substrate, which are vulnerable to high temperature, cannot be used.

Upon heat treatment of the gate insulating film solution, ultraviolet light may be selectively irradiated to break metal-oxygen bonds and recombine the same again, thereby forming a high-quality gate insulating film.

The semiconductor layer 140 is formed on the gate insulating film 130. The semiconductor layer 140 may be formed, without being limited to, using a known metal deposition method such as sputtering, chemical vapor deposition, thermal evaporation, physical vapor deposition, or a solution process. When the semiconductor layer 140 is formed by a solution process, any one known solution process such as spin coating, bar coating, dip coating, nanoimprinting, and inkjet printing, as with the gate insulating film 130, may be used.

The source and drain electrodes 150 and 160 are formed on the semiconductor layer 140. The source electrode 150 and the drain electrode 160 are spaced from each other by a portion of the semiconductor layer 140 used as an active region. The source electrode 150 and the drain electrode 160 may be formed, without being limited to, using a known metal deposition method such as sputtering, chemical vapor deposition, thermal evaporation, physical vapor deposition, or a solution process.

Upon fabrication of the top gate-type thin film transistor shown in FIG. 2, the order of the aforementioned respective steps may be changed. That is, the source and drain electrodes 150 and 160 are formed on the substrate 110. The semiconductor layer 140 is formed on the source electrode 150, the drain electrode 160, and an exposed region of the substrate 110. The gate insulating film 130 is formed on the semiconductor layer 140 through the solution process as described above. The gate electrode 120 may be deposited on the gate insulating film 130 to fabricate an top gate-type thin film transistor.

Experimental Example: Thin film transistor including aluminum yttrium oxide gate insulating film A molar ratio of an aluminum nitrate nonahydrate to an yttrium nitrate hexahydrate was adjusted, and the aluminum nitrate nonahydrate and yttrium nitrate hexahydrate was mixed with a 2-methoxyethanol dispersion medium, thereby preparing a gate insulating film solution. A p-type-doped silicon wafer was subjected to UV surface treatment for 30 minutes using a UVO cleaner ($\lambda$=254 nm, 185 nm) to convert a hydrophobic surface thereof into a hydrophilic state. Subsequently, the silicon wafer was spin-coated with the gate insulating film solution. The spin coating was performed at 3000 rpm for 30 seconds, and pre-baking was performed at 100° C. for 5 minutes, followed by heat-treating at 400° C. for 1 hour in a box furnace. A surface of the heat-treated thin film was irradiated with UV for 30 minutes using a UVO cleaner, as described above, in order to be converted into a hydrophilic state, and the above process was repeated three times to laminate a thin film to a thickness of 30 nm to 40 nm. Under an atmosphere wherein a ratio of an oxygen gas to a total gas flow rate is 10%, an indium zinc oxide semiconductor layer was laminated to a thickness of 30 nm. Using a metal shadow mask, an ITO source electrode and drain electrode with a width of 100 μm and a length of 150 μm were formed on both ends of the semiconductor layer. Heat treatment was performed at 400° C. for 1 hour, thereby fabricating a thin film transistor.

including yttrium oxide exhibits a high current density of $2.4\times10^{-6}$ A/cm$^2$, whereas the thin film transistors of Experimental Examples 2, 3 and 4 fabricated according to the examples of the present invention exhibit a low current density of $4.9\times10^{-9}$ A/cm$^2$ to $1.8\times10^{-8}$ A/cm$^2$. Therefore, it

TABLE 1

| | Al:Y | $Al_{2-x}Y_xO_3$ | $\mu_{sat}/\mu_{lin}$ (cm$^2$/Vs) | SS (V/decade) | Vth (V) | Ion/off | Thickness | Cap (nF/cm$^2$) | K (dielectric) |
|---|---|---|---|---|---|---|---|---|---|
| 1 | Al | $Al_2O_3$ | 44.4 | 0.11 | −0.5 | $2.5 \times 10^6$ | 37.00 nm | — | 11.5 ± 1.0 |
| 2 | Al:Y = 4:1 | $Al_{1.6}Y_{0.4}O_3$ | 47.7 | 0.23 | −1.37 | $1.0 \times 10^6$ | 34.70 nm | — | 12.2 ± 0.5 |
| 3 | Al:Y = 1:1 | $Al_1Y_1O_3$ | 58.7 | 0.20 | −1.49 | $1.7 \times 10^6$ | 37.00 nm | 419 | 16.5 ± 1.1 |
| 4 | Al:Y = 1:4 | $Al_{0.4}Y_{1.6}O_3$ | 52.9 | 0.19 | −0.51 | $3.6 \times 10^6$ | 37.00 nm | 443 | 19.2 ± 1.2 |
| 5 | Al:Y = 1:6 | $Al_{0.29}Y_{1.71}O_3$ | 54.1 | 0.21 | −0.80 | $5.0 \times 10^6$ | 37.68 nm | 394 | 16.6 |
| 6 | Al:Y = 1:8 | $Al_{0.22}Y_{1.78}O_3$ | 52.4 | 0.10 | −0.78 | $1.0 \times 10^7$ | 36.61 nm | 399 | 16.7 |
| 7 | Al:Y = 1:10 | $Al_{0.18}Y_{1.82}O_3$ | 46.6 | 0.07 | −0.65 | $1.7 \times 10^7$ | 39.95 nm | 424 | 19.3 |
| 8 | Al:Y = 1:12 | $Al_{0.15}Y_{1.85}O_3$ | 48.5 | 0.31 | −0.92 | $10^6$ | 40.00 nm | 429 | 19.5 |
| 9 | Y | $Y_2O_3$ | 60.8 | 0.3 | −0.6 | $10^4$ | 40.00 nm | — | 16 |

Table 1 shows the properties of thin film transistors fabricated by varying a molar ratio of an aluminum precursor to an yttrium precursor. Experimental Examples 2 to 8 correspond to thin film transistors fabricated according to the present invention, and Experimental Examples 1 and 9 correspond to comparative examples fabricated for comparison.

Referring to Table 1, thin films fabricated by varying a molar ratio of an aluminum precursor to an yttrium precursor may be represented by $Al_{2-x}Y_xO_3$. Here, a ratio of 2-x to x is the same as a ratio of the aluminum precursor to the yttrium precursor. When x is 0.4 to 1.85, a high dielectric constant of 12 or more and a current on/off ratio of $1.0\times10^6$ or more can be confirmed.

In particular, it can be confirmed that, when x is 1 to 1.82, a current on/off ratio increases to $1.7\times10^6$ or more and a dielectric constant is larger than 16 which is a dielectric constant of an yttrium oxide film.

A current on/off ratio can be high when a leakage current is effectively suppressed. Therefore, it is considered that, when x is 1 to 1.82, a dielectric constant larger than that of an yttrium oxide film is exhibited and leakage current generation due to an increased grain boundary is effectively suppressed.

TABLE 2

| Al:Y | | | at. % | |
|---|---|---|---|---|
| 0.1M | $Al_{2-x}Y_xO_3$ | Al(%) | Y(%) | O(%) |
| 2 4:1 | $Al_{1.6}Y_{0.4}O_3$ | 21.97 | 7.32 | 70.70 |
| 3 1:1 | $Al_1Y_1O_3$ | 14.88 | 14.54 | 70.57 |
| 4 1:4 | $Al_{0.4}Y_{1.6}O_3$ | 5.54 | 20.46 | 73.99 |
| 5 1:6 | $Al_{0.29}Y_{1.71}O_3$ | 4.07 | 22.28 | 73.66 |
| 6 1:8 | $Al_{0.22}Y_{1.78}O_3$ | 3.72 | 21.47 | 74.80 |
| 7 1:10 | $Al_{0.18}Y_{1.82}O_3$ | 2.75 | 26.25 | 71.00 |

Table 2 shows atomic % of gate insulating films of the thin film transistors of Experimental Examples 2 to 7 fabricated according to the present invention measured by X-ray fluorescence analysis.

Figure 4:
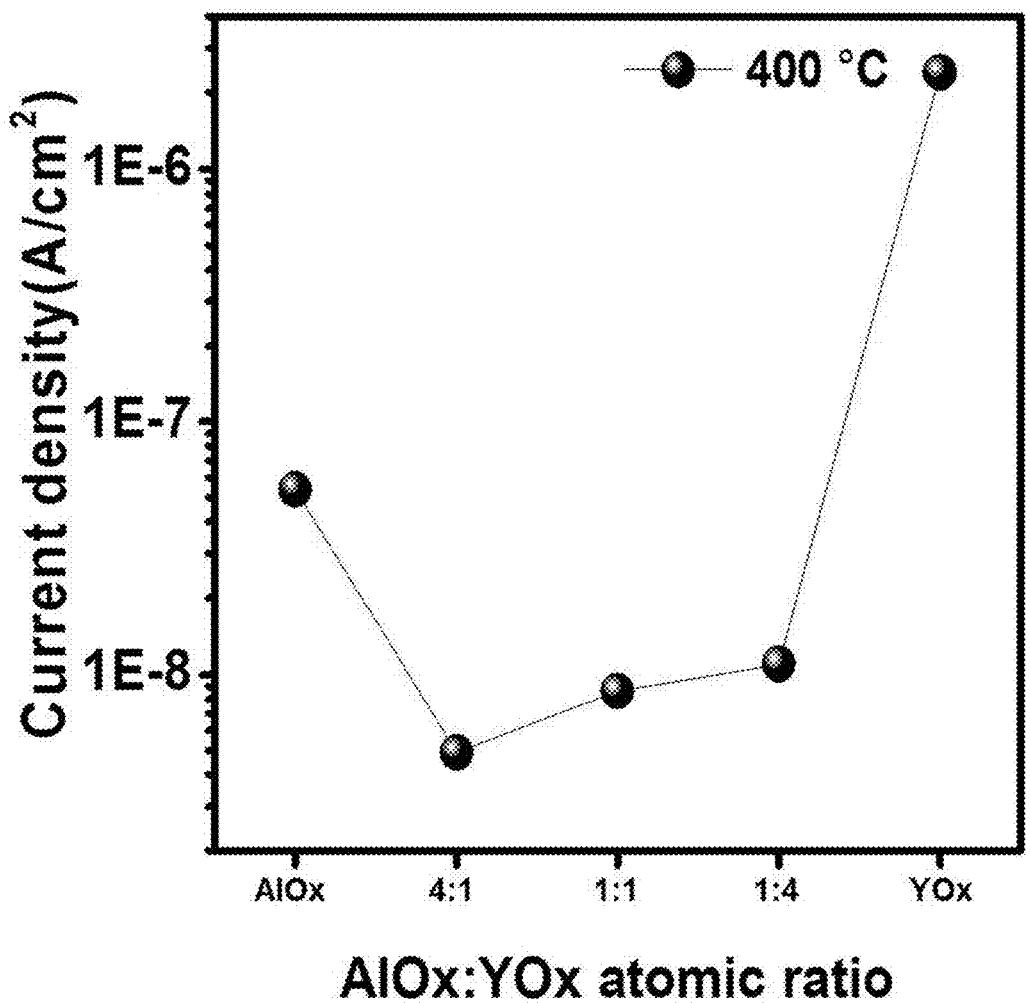
FIG. 4 illustrates current densities of gate insulating films dependent upon a ratio of an aluminum precursor to an yttrium precursor which were added during preparation of gate insulating film solutions.

FIG. 4 illustrates current densities of gate insulating films dependent upon a ratio of an aluminum precursor to an yttrium precursor which were added during preparation of gate insulating film solutions.

Referring to FIG. 4, it can be confirmed that a current density of the gate insulating film only including aluminum oxide is $8.7\times10^{-8}$ A/cm$^2$ and the gate insulating film only can be confirmed that the gate insulating films fabricated according to the experimental examples of the present invention exhibit excellent insulating properties.

Figure 5A:
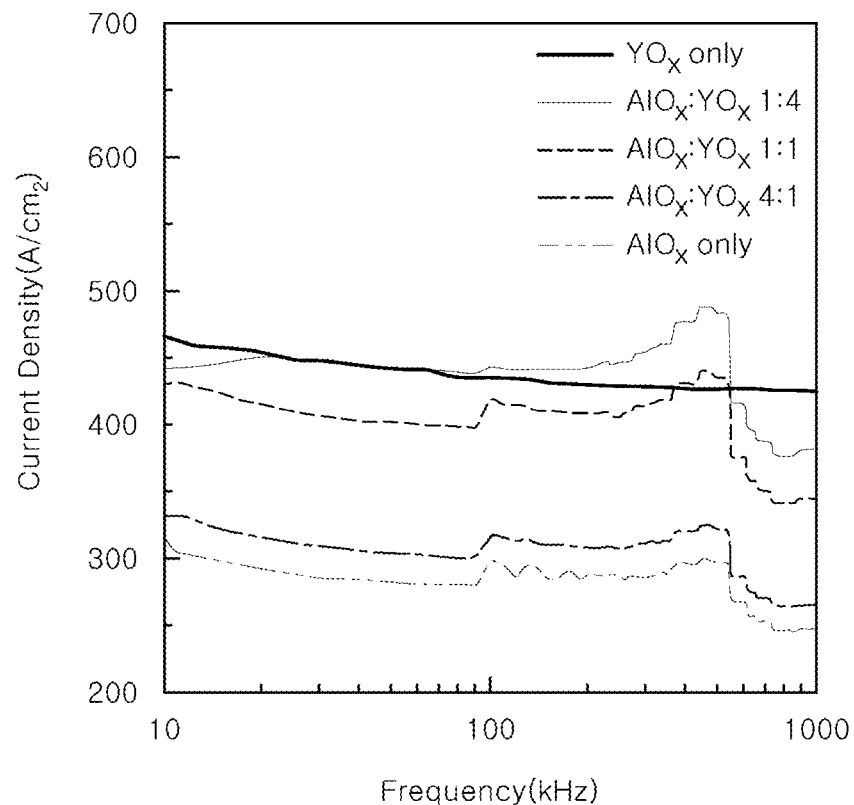
FIGS. 5A and 5B illustrate capacitances of gate insulating films dependent upon a ratio of an aluminum precursor to an yttrium precursor, which have been added during preparation of gate insulating film solutions.
Figure 5B:
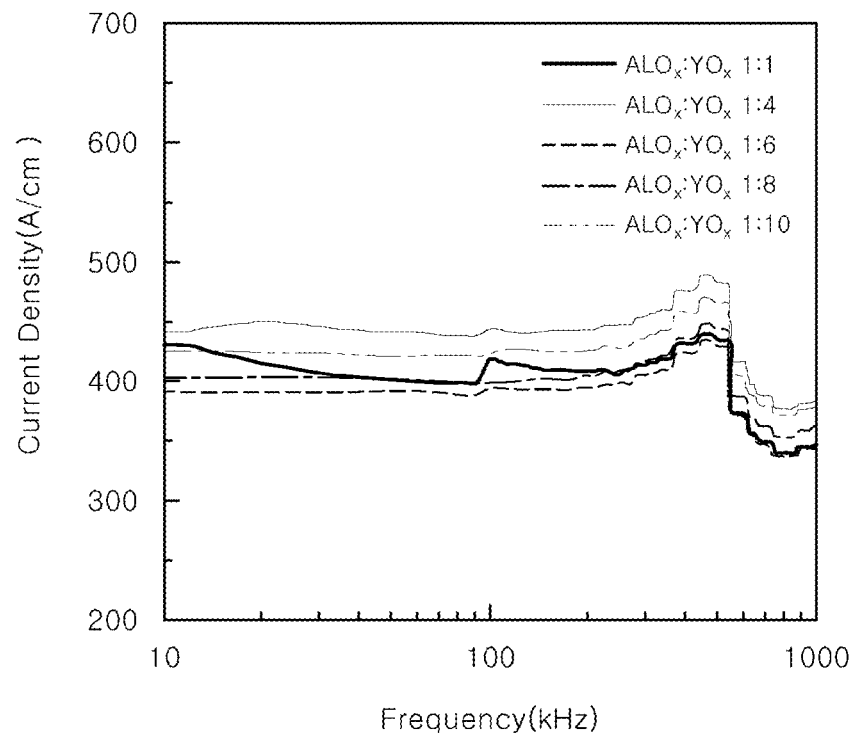

FIGS. 5A and 5B illustrate capacitances of gate insulating films dependent upon a ratio of an aluminum precursor to an yttrium precursor, which have been added during preparation of gate insulating film solutions.

Referring to FIG. 5A, it can be confirmed that a capacitance increases with an increasing molar ratio of an yttrium precursor to an aluminum precursor. In addition, it can be confirmed that a capacitance of Experimental Example 2, wherein a ratio of an aluminum precursor to an yttrium precursor is 4:1, is similar to that of an aluminum oxide thin film, whereas, when a ratio of an yttrium precursor to an aluminum precursor is 1:1 or more, a capacitance is similar to or higher than that of an yttrium oxide thin film.

Referring to FIG. 5B, it can be confirmed that Experimental Examples 3 to 7, in which a ratio of an yttrium precursor to 1 mole of an aluminum precursor is 1 to 10 moles, exhibit a high capacitance of about 400 nF/cm$^2$. A capacitance is considered to increase with an increasing molar ratio of an yttrium precursor because the number of hydroxyl groups increases, the density of a thin film itself increases, and a bonding ratio of a metal to oxygen increases.

Figure 6:
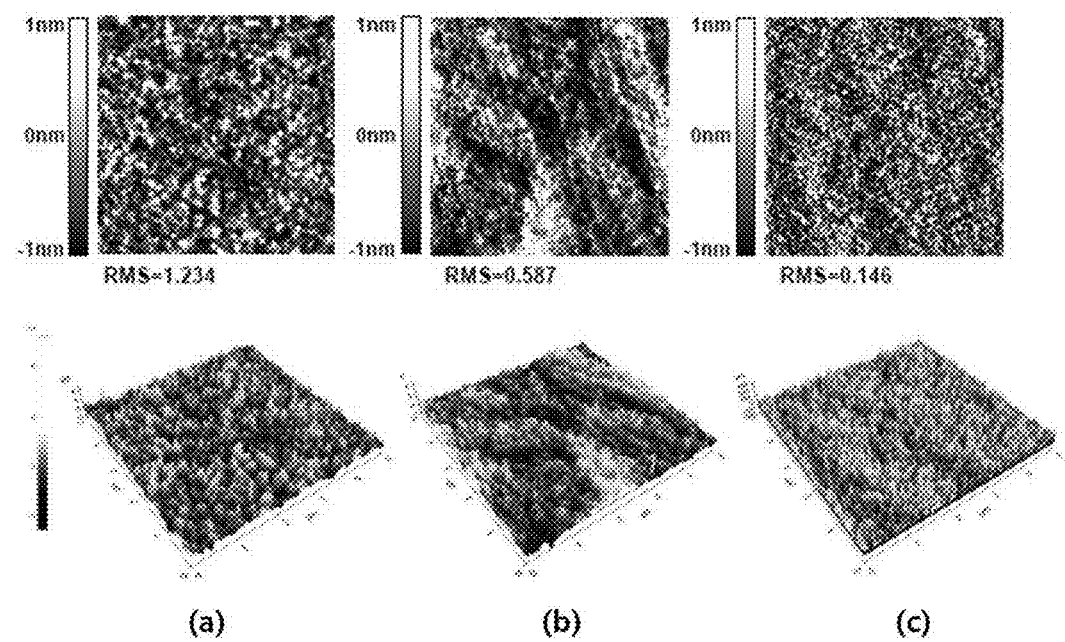
FIG. 6 illustrates AFM measurement results of (a) an yttrium oxide thin film, (b) an aluminum oxide thin film and (c) a gate insulating film of a thin film transistor according to an embodiment of the present invention.

FIG. 6 illustrates AFM measurement results of (a) an yttrium oxide thin film, (b) an aluminum oxide thin film and (c) a gate insulating film of a thin film transistor according to an embodiment of the present invention.

Referring to FIG. 6, it can be confirmed that, in the case of the yttrium oxide thin film of Experimental Example 9 (a), nanoparticles having a large grain boundary are observed and a large average surface roughness value of 1.234 is measured. The aluminum oxide thin film of Experimental Example 1(b) exhibits an average surface roughness value of 0.587, which indicates that the aluminum oxide thin film is smoother than the yttrium oxide thin film. It can be confirmed that, in the case of the thin film of Experimental Example 4 (c) in which a molar ratio of an aluminum precursor to an yttrium precursor is 1:4, an average surface roughness is 0.146, which indicates that the thin film of Experimental Example 4 is smoother than the aluminum oxide thin film. This result is considered to occur because the space between large yttrium atoms is filled by small aluminum atoms and thus a smoother and denser thin film was formed. Such a smooth thin film can be expected to improve interfacial characteristics of the gate insulating film.

Figure 7A:
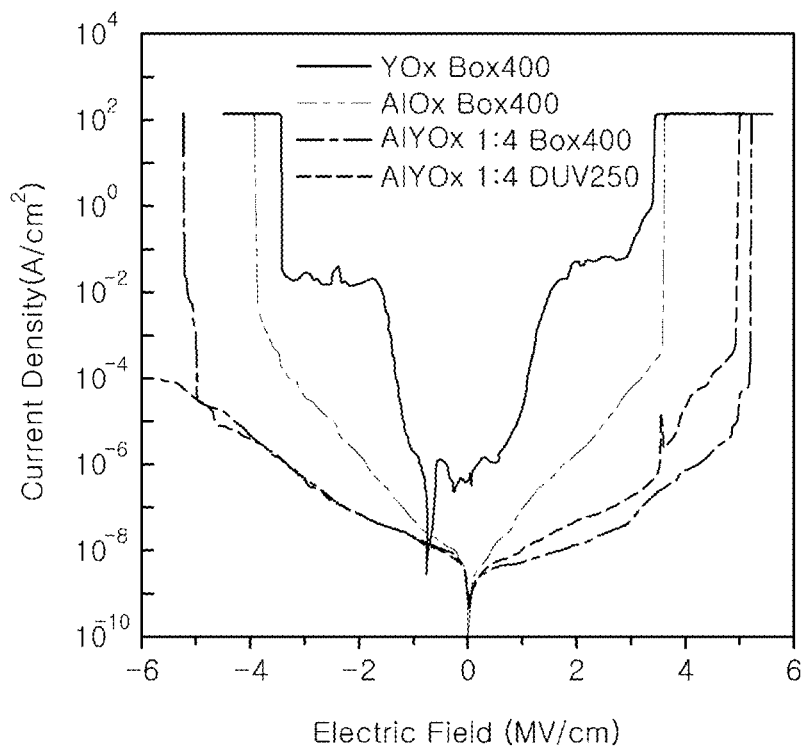
FIGS. 7A and 7B illustrate current densities when an yttrium oxide thin film, an aluminum oxide thin film, and a gate insulating film according to an embodiment of the present invention are heat-treated or are irradiated with ultraviolet light simultaneously with heat treatment.
Figure 7B:
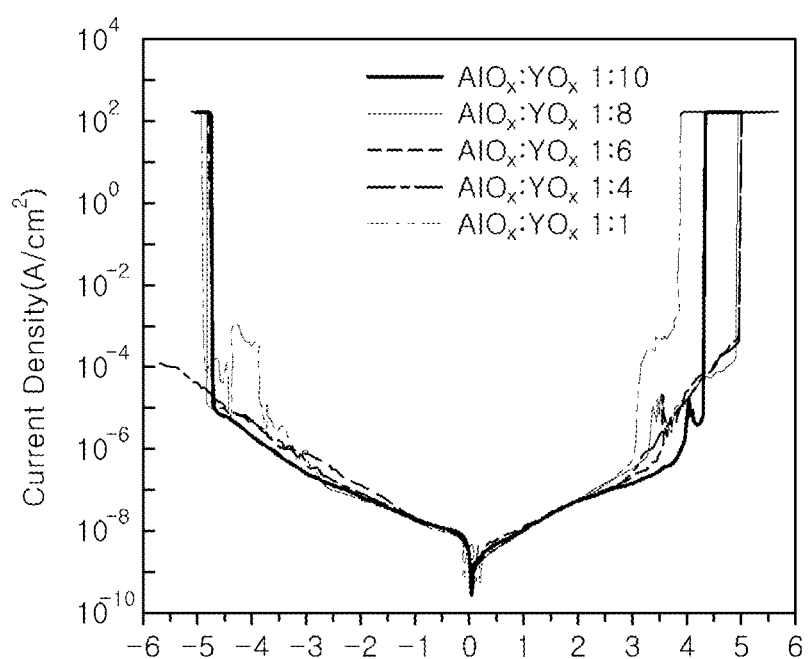

FIGS. 7A and 7B illustrate current densities when an yttrium oxide thin film, an aluminum oxide thin film, and a gate insulating film according to an embodiment of the present invention are heat-treated or are irradiated with ultraviolet light simultaneously with heat treatment.

Referring to FIG. 7A, it can be confirmed that, when the thin film of Experimental Example 4 according to the present invention wherein a ratio of an aluminum precursor to an yttrium precursor is 1:4 was heat-treated at 400° C. for 1 hour, the thin film exhibits low leakage current and high breakdown field, compared to the aluminum oxide film (Experimental Example 1) or the yttrium oxide film (Experimental Example 9). In addition, when ultraviolet light having wavelengths of 185 nm and 254 nm was irradiated while heat-treating at a low temperature of 250° C., a result similar to that obtained by heat-treating at 400° C. was obtained. In particular, it was confirmed that an absolute value of an electric field, in which insulation breaks down when a negative electric field is applied, extremely increased. This is considered to occur because ultraviolet light breaks a bond between the metal and oxygen and heat energy recombines the same.

Referring to FIG. 7B, it was confirmed that, when the gate insulating films of Experimental Examples 3 to 7 wherein a molar ratio of an yttrium precursor with respect to 1 mole of an aluminum precursor was 1 to 10 were subjected to a current measurement test, they also exhibited low leakage current and high breakdown field like the insulating film of Experimental Example 4 shown in FIG. 7A.

A thin film transistor according to the present invention includes a gate insulating film that includes a ternary high-dielectric material, $A_{2-x}B_xO_3$. Here, A can be any one selected from the group consisting of aluminum, silicon, gallium, germanium, neodymium, gadolinium, vanadium, lutetium, and actinium, and B can be any one selected from the group consisting of yttrium, lanthanum, zirconium, hafnium, tantalum, titanium, vanadium, nickel, silicon, and ytterbium.

Aluminum oxide has excellent insulating properties due to a large band gap, but has a dielectric constant of only 9 to 10 at 1 MHz, which may not be advantageous for formation of a thin film for scaling down and low-voltage driving. On the other hand, band gaps of materials with a high dielectric constant, such as hafnium oxide, and zirconium oxide, are small and tend to decrease with an increasing dielectric constant. Therefore, since the gate insulating film of the thin film transistor according to the present invention is fabricated using a ternary high-dielectric material prepared by mixing a material having a high dielectric constant with a material having superior insulating properties, the thin film transistor including the gate insulating film exhibits excellent electrical characteristics. In addition, since the space between large atoms is filled by small atoms by mixing metals having different atomic radii, the density of the thin film increases and the thin film can exhibit a smooth interfacial characteristic.

Since a solution process-based thin film deposition method is used instead of vacuum-based thin film deposition methods, such as sputtering, chemical vapor deposition, and thermal evaporation, upon formation of the gate insulating film, a thin film transistor can be fabricated by a method which is simple and low-cost and provide a high yield.

It will be understood that technical effects of the present invention are not limited to those mentioned above and other unmentioned technical effects will be clearly understood by those skilled in the art from the disclosure above.

What is claimed is:

1. A thin film transistor comprising:
a semiconductor layer;
a source electrode and a drain electrode electrically contacting with the semiconductor layer;
a gate electrode positioned over or under the semiconductor layer; and
a gate insulating film positioned between the semiconductor layer and the gate electrode, made of $Al_{2-x}Y_xO_3$, and having a higher dielectric constant than $SiO_2$,
wherein x is 1.6 to 1.82.

2. The thin film transistor of claim 1, wherein x is 1.78 to 1.82.

3. The thin film transistor of claim 1, wherein the gate insulating film has a thickness of 30 nm to 40 nm.

4. The thin film transistor of claim 1, wherein the semiconductor layer is an oxide semiconductor layer.

5. The thin film transistor of claim 4, wherein the semiconductor layer includes at least any one of InZnO, InGaZnO, ZnO, ZnSnO, InSnO, InZnSnO, HfInZnO, ZrZnSnO, and HfZnSnO.

6. A method of fabricating a thin film transistor including a semiconductor layer, a source electrode and a drain electrode electrically contacting with the semiconductor layer, a gate electrode positioned over or under the semiconductor layer, and a gate insulating film positioned between the semiconductor layer and the gate electrode, comprising:
mixing a precursor of element A and a presursor of element B with a dispersion medium to prepare a gate insulating film solution,
applying the gate insulating film solution on the gate electrode or the semiconductor layer, and
heat-treating the applied gate insulating film solution to form a gate insulating film which is made of $Al_{2-x}Y_xO_3$, and having a higher dielectric constant than $SiO_2$,
wherein x is 1.6 to 1.82.

7. The method of fabricating a thin film transistor of claim 6, wherein the precursors of elements Al and Y are a nitrate hydrate thereof.

8. The method of fabricating a thin film transistor of claim 6, wherein the dispersion medium is any one or more selected from isopropanol, 2-methoxyethanol, dimethylformamide, ethanol, deionized water, methanol, acetyl acetone, and acetonitrile.

9. The method of fabricating a thin film transistor of claim 6, wherein a molar ratio of the precursor of element Y with respect to 1 mole of the precursor of element Al is 0.25 to 12.

10. The method of fabricating a thin film transistor of claim 9, wherein a molar ratio of the precursor of element Y with respect to 1 mole of the precursor of element Al is 1 to 10.

11. The method of fabricating a thin film transistor of claim 10, wherein a molar ratio of the precursor of element Y with respect to 1 mole of the precursor of element Al is 8 to 10.

12. The method of fabricating a thin film transistor of claim 6, wherein, in the step of heat-treating the applied gate insulating film solution, the heat treatment is performed at 250° C. to 400° C.

13. The method of fabricating a thin film transistor of claim 6, wherein, in the step of heat-treating the applied gate insulating film solution, ultraviolet light is irradiated while performing the heat treatment.

* * * * *